United States Patent [19]

Saleh

[11] Patent Number: 4,591,803
[45] Date of Patent: May 27, 1986

[54] LINEAR FET POWER AMPLIFIER

[75] Inventor: Adel A. M. Saleh, Holmdel, N.J.

[73] Assignee: AT&T Bell Laboratories, Murray Hill, N.J.

[21] Appl. No.: 614,527

[22] Filed: May 29, 1984

[51] Int. Cl.[4] .......................... H03F 3/16; H03F 3/60
[52] U.S. Cl. .................................. 330/277; 330/286; 330/296; 330/297
[58] Field of Search ................ 330/277, 286, 296, 297

[56] References Cited

U.S. PATENT DOCUMENTS 4,110,700  8/1978  Rosen et al. ..................... 329/103
4,342,967  8/1982  Regan et al. .................... 330/277

OTHER PUBLICATIONS

Goel, "A 4-8 GHz Dual Gate M.E.S.F.E.T. Amplifier" *Electronics Letters*, vol. 14, No. 6, Mar. 16, 1978, pp. 167,168.
Yokouchi et al., "4 GHz 3 Watts FET Amplifier for Digital Transmission", Conference: 1978 IEEE MTT-S International Microwave Symposium, Ottawa Canada, Jun. 27-29, 1978, pp. 276-278.
"Five Basic Bias Designs for GaAs FET Amplifiers", *Microwaves*, Feb. 1978.
"Improving the Power-Added Efficiency of FET Amplifiers Operating with Varying-Envelope Signals", *IEEE Transactions on Microwave Theory and Techniques*, vol. 31, No. 1, Jan. 1983, pp. 51-56, Saleh et al.
Saleh et al., "Adaptive Linearization of Power Amplifiers in Digital Radio Systems", *Bell System Technical Journal*, vol. 62, No. 4, Apr. 1983, pp. 1019-1033.

*Primary Examiner*—James B. Mullins
*Attorney, Agent, or Firm*—Erwin W. Pfeifle

[57] ABSTRACT

The present invention relates to an FET power amplifier whose transfer characteristics are parabolic or have a pronounced parabolic region. The amplifier is capable of linear operation due to a drain electrode bias network which includes a pair of serially connected quarter-wave transmission line sections connected at one end thereof to the drain electrode, and the interconnection point of the two quarter-wave transmission line sections is connected to both (a) a bias supply which causes the FET to operate over at least a portion of the parabolic region and (b) to a means which prevents envelope-induced drain bias voltage variations and presents a short-circuit to the drain terminal at a second harmonic of the input signal.

4 Claims, 2 Drawing Figures

LINEAR FET POWER AMPLIFIER

TECHNICAL FIELD

The present invention relates to a linear FET power amplifier and, more particularly, to a linear FET power amplifier whose transfer characteristics are parabolic or have a pronounced parabolic region. The amplifier is able to operate linearly within the parabolic region due to a drain bias circuit which comprises a pair of serially connected quarter-wave line sections with both a drain bias supply and a shunt capacitor connected to the interconnection point of the two quarter-wave line sections.

DESCRIPTION OF THE PRIOR ART

Traditionally, satellite and terrestrial communication systems have utilized constant-envelope, single-carrier signals employing, for example, analog frequency modulation (FM), or digital phase-shift keying (PSK). The main advantage of such signals is their relative immunity to nonlinearities, which enables driving a transmitter power amplifier near saturation, thus maximizing its efficiency. However, these modulation schemes do not utilize the frequency spectrum efficiently. In fact, most communication systems that are being currently implemented utilize analog, single-sideband (SSB) amplitude modulation, and digital, quadrature amplitude modulation (QAM), which are quite efficient in bandwidth utilization. Furthermore it is often required to have a number of carriers share the same communication channel, e.g., a satellite transponder, in a frequency-division multiple-access (FDMA) mode of operation.

The problem with SSB, QAM, and FDMA signals is that they have highly time-varying envelopes, which require the power amplifier to operate with a high degree of linearity. This is accomplished by backing off the amplifier's output power away from saturation so as to restrict the range of signal envelope variations to the essentially linear region of amplification. In a field-effect-transistor (FET) power amplifier operating in standard class A, the required drain dc bias power is a constant that is set by the amplifier's saturated output power rating, and is essentially independent of the actual signal power level. Thus, the amplifier efficiency is reduced from its maximum (single-carrier, near-saturation) value by the amount of the output power backoff. Such a reduction in efficiency results in a severe power penalty, which could be unacceptable, especially on a satellite where the available dc power is costly.

The operational efficiency of the amplifier can be greatly increased through the use of an analog or a digital predistorter linearizer as disclosed, for example, in the article "Adaptive Linearization of Power Amplifiers In Digital Radio Systems" by A. A. M. Saleh et al in *BSTJ*, Vol. 62, No. 4, April 1983 at pages 1019–1033. Such a device, in effect, pushes the upper limit of the amplifier's linear region closer to saturation. However, even if this was done perfectly, the efficiency of the amplifier would still be reduced from its maximum value by an amount equal to the peak-to-average power ratio of the varying-envelope signal, which can be of the order of two to three decibels.

A technique for eliminating most of this reduction was disclosed in the article "Improving The Power-Added Efficiency of FET Amplifiers Operating With Varying-Envelope Signals" by A. A. M. Saleh et al in *IEEE Transactions On Microwave Theory and Techniques*, Vol. MTT-31, No. 1, January 1983 at pages 51–56. This technique is referred to as "class $\bar{A}$" operation. It involves the use of an external circuit to dynamically control the gate dc bias voltage of the FET with the envelope of the input rf signal such that the drain dc bias current is proportional to the envelope. Thus, the dc bias power would no longer be fixed at its maximum value; rather, it would vary up and down with the signal envelope, thus reducing the dc power consumption and increasing the efficiency. The use of this technique, however, is limited to FETs with linear transfer characteristics over most of their dynamic range. In fact, a linear transfer characteristic is implicit in standard class-A operation, and is usually sought by high-power FET device manufacturers.

The problem remaining in the prior art, therefore, is to provide a linear FET power amplifier which can operate efficiently for varying-envelope signals, e.g., SSB or QAM signals, where standard class-A amplifiers operate inefficiently, and where class $\bar{A}$ operation would require a complex external circuit.

SUMMARY OF THE INVENTION

The foregoing problem has been solved in accordance with the present invention which relates to a linear FET power amplifier which includes an FET whose transfer characteristics are parabolic or have a pronounced parabolic region. The amplifier is able to operate linearly within the parabolic region due to a drain bias circuit which comprises a pair of serially connected quarter-wave line sections with both a drain bias supply and a shunt capacitor connected to the interconnection point of the two quarter-wave line sections. The quarter-wave sections and capacitor function to (a) prevent the rf output signal from reaching the bias supply, (b) short out the second harmonic of the output rf signal, and (c) prevent variations of the rf envelope or modulation frequency from influencing the bias voltage.

It is an aspect of the present invention to enable FETs with parabolic transfer characterisitcs to be capable of linear amplification with approximately the same efficiency improvements of class $\bar{A}$, but without the need for an external gate-bias-control circuit.

Other and further aspects of the present invention will become apparent during the course of the following description and by reference to the accompanying drawings.

BRIEF DESCRIPTION OF THE DRAWINGS

Referring now to the drawings.

DETAILED DESCRIPTION

In accordance with the present invention, an amplifier arrangement is provided which permits a field effect transistor (FET) with parabolic transfer characteristics (PTC) to be capable of linear amplification with approximately the same efficiency improvements of a class $\bar{A}$ amplifier as described in the Saleh et al article in *IEEE Trans. on MTT*, Vol. MTT-31, No. 1, January 1983 at pages 51–56. For an understanding of the theory of operation and the efficiency of the PTC mode of power amplification, the idealized models for the FET and the present power amplifier are presented.

Figure 1:
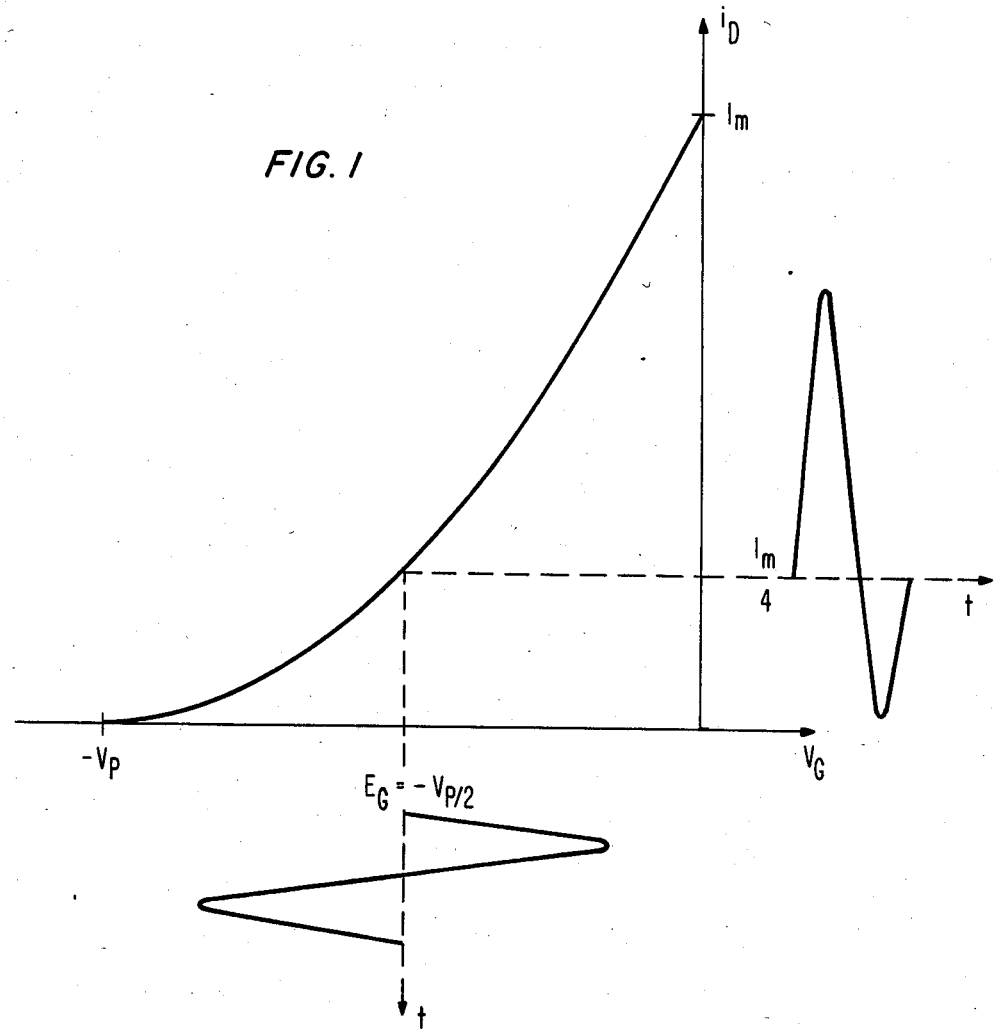
FIG. 1 is a curve representative of the idealized operation in the parabolic transfer characteristics mode.

Let $i_D(t)$, $v_D(t)$ and $v_G(t)$ be the instantaneous drain current, drain voltage and gate voltage, respectively. Furthermore, let $I_m$ be the maximum allowable drain current, which is assumed to occur at $v_G=0$; let $V_m$ be the maximum allowable drain voltage, beyond which drain-to-gate breakdown would occur; and let $V_p$ be the gate pinch-off voltage, at which $i_D=0$. The transfer characteristic of the FET will be represented by the parabola $$i_D = I_m(1 + v_G/V_p)^2, \tag{1}$$

which is depicted in FIG. 1. It will be assumed that equation (1) is valid, independently of $v_D$, provided that the operating range is confined to $$0 \leq i_D \leq I_m, \tag{2a}$$

$$0 \leq v_D \leq V_m, \tag{2b}$$

$$-V_P \leq v_G \leq 0. \tag{2c}$$

The same terminology and assumptions, without the exponent in equation (1), were employed in the idealized FET model used in the article by Saleh et al in *IEEE Trans. on MTT*, January 1983, for the analysis of classes A and Ā. This is done to facilitate direct comparison between these modes and the PTC mode.

Figure 2:
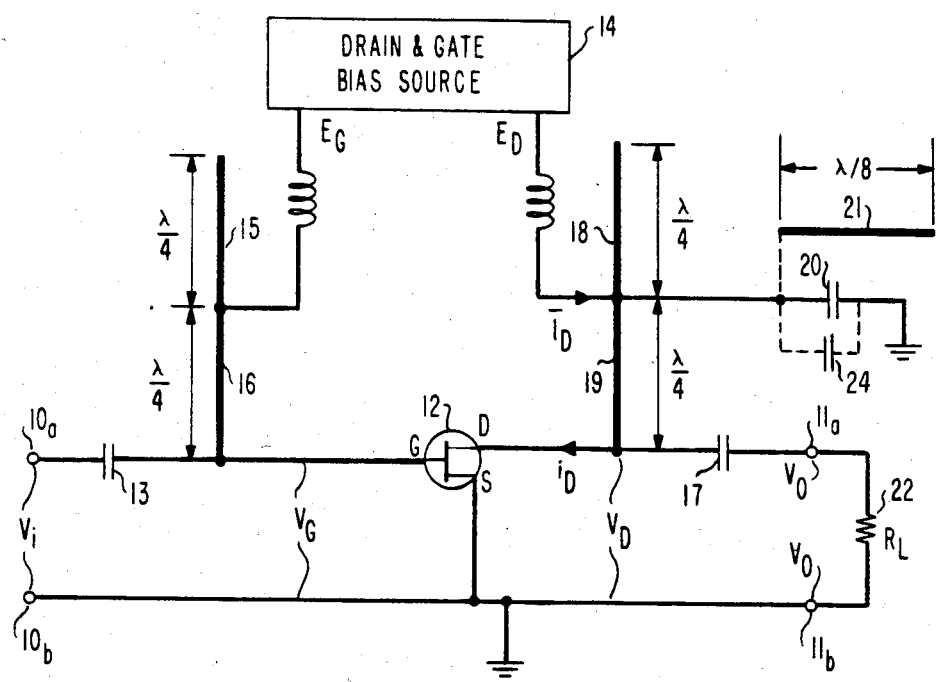
FIG. 2 is a schematic circuit diagram of the FET power amplifier in accordance with the present invention.

An FET power amplifier circuit in accordance with the present invention is shown in FIG. 2. There, an input signal is received at terminals 10a and 10b and the amplified signal is delivered to output terminals 11a and 11b, respectively. Input terminal 10a is shown coupled to the gate of an FET 12 via a blocking capacitor 13. The bias to the gate of FET 12 is supplied from a bias source 14 through the interconnection point of a pair of serially connected quarter-wave transmission line sections 15 and 16, where the free end of quarter-wave section 16 is connected to the transmission line connecting capacitor 13 and the gate of FET 12.

The drain of FET 12 is coupled to output terminal 11a via a blocking capacitor 17. The bias to the drain of FET 12 is supplied from bias source 14 through the interconnection point of a pair of serially connected quarter-wave transmission line sections 18 and 19, where the free end of quarter-wave section 19 is connected to the transmission line between the drain of FET 12 and capacitor 17. A shunt capacitor 20 is also connected to the interconnection point between quarter-wave transmission line sections 18 and 19 to prevent the drain bias current variations, which are induced by the signal envelope variations, from modulating the dc drain bias voltage. Additionally, capacitor 20 is presumed to be broadband so as it presents a short to the drain terminal at the second harmonic of the signal. This is accomplished through the lower quarter-wave section 19, which is a half-wave long at the second harmonic. It is to be understood that in practice, capacitor 20 would probably be a parallel combination of two capacitors, one (20) for preventing an effect on the drain bias current by envelope frequencies and the other, designated 24, for shorting the second harmonic. The latter capacitor, 24, could instead be replaced by an eighth-wave open-circuit transmission line section 21. The free ends of quarter-wave sections 15 and 18 and eighth-wave section 21 are unconnected.

The transmission line interconnecting input terminal 10b and output terminal 11b and the source of FET 12 are shown coupled to a common ground. A load resistance 22, designating any user device of the amplified signal, is shown connected between output terminals 11a and 11b.

To understand the theory of operation, let the band-limited input voltage at terminals 10a and 10b be in the general form $$v_i(t) = V_i(t) \cos[\omega t + \phi(t)], \tag{3}$$

where $V_i(t)$ is the time-varying input envelope. Thus, the instantaneous gate voltage is $$v_G(t) = E_G + v_i(t), \tag{4}$$

where $E_G$ is the gate dc bias voltage, which is a negative quantity. Substituting equations (3) and (4) into equation (1) and expanding, one obtains the instantaneous drain current $$i_D(t) = I_m\{[1 + E_G/V_P]^2 + \tfrac{1}{2}[V_i(t)/V_P]^2 + 2[-1 + E_G/V_P][V_i(t)/V_P]\cos[\omega t + \phi(t)] + \tfrac{1}{2}[V_i(t)/V_P]^2 \cos[2\omega t + 2\phi(t)]\}. \tag{5}$$

The first term in equation (5) represents dc and low-frequency terms, the second term represents the fundamental output signal current, and the third term represents the second harmonic term. Because of the filtering properties of the output network, comprising line sections 18 and 19 and capacitor 20 in FIG. 2, only the fundamental component of the current would flow in the load, resulting in an output signal voltage of the form $$v_o(t) = V_o(t) \cos[\omega t + \phi(t)], \tag{6}$$

where $$V_o(t) = 2[1 + E_G/V_P][I_m R_L/V_P]V_i(t) \tag{7}$$

is the output signal envelope.

The linear input-output relation indicated by comparing equations (3) to (6) and (7) follows since the only nonlinear distortions resulting from the parabolic characteristic of equation (1) are the low-frequency and the second-harmonic terms in equation (5), which are both easily filtered out (actually short-circuited) by the output circuit, without affecting the signal. This would not have been possible if the input signal had an octave (or wider) bandwidth since the spectra of both of the aforementioned nonlinear terms would fall within the signal bandwidth.

The preceding description has shown only that the PTC mode produces linear amplification. The following description is directed towards finding its optimum output power and efficiency. As depicted in FIG. 1, the gate should be biased at $$E_G = -V_P/2 \tag{8}$$

in order to maximize the input envelope that can be handled by the amplifier without clipping, i.e., without violating equation (2c). This leads to $$V_i(t) \leq V_{i,max} = V_P/2. \tag{9}$$

Similarly, in the output side, since $v_D(t) = E_D + v_o(t)$, it follows from equations (2b) and (6) that the output envelope limit is maximized if $$E_D = V_m/2, \qquad (10)$$

in which case, $$V_o(t) \leq V_{o,max} = V_m/2. \qquad (11)$$

For optimum operation, $V_i(t)$ and $V_o(t)$ should attain their respective limiting values, $V_{i,max}$ and $V_{o,max}$, simultaneously. It can be seen from equation (7) that this is achieved when the load resistor 21 assumes its optimum value $$R_L = (V_P V_{o,max}/I_m V_{i,max}) = V_m/I_m. \qquad (12)$$

The normalized signal envelope can be defined by $$r(t) \equiv (V_o(t)/V_{o,max}) = (V_i(t)/V_{i,max}) \leq 1, \qquad (13)$$

where the second equality follows only if equation (12) is satisfied. Using equations (8), (9) and (13), one can put equation (5) in the normalized form $$i_D(t) = I_m\{\tfrac{1}{4} + \tfrac{1}{8}r^2(t) + \tfrac{1}{2}r(t)\cos[\omega t + \phi(t)] + \tfrac{1}{8}r^2(t)\cos[2\omega t + 2\phi(t)]\}. \qquad (14)$$

The fundamental component of the output current is $$I_o(t) = r(t)I_m/2 = V_o(t)/R_L, \qquad (15)$$

and thus, the rf output power is $$P_o(t) \equiv V_o(t)I_o(t)/2 = r^2(t)V_m I_m/8, \qquad (16)$$

which is identical to that given by Saleh et al in *IEEE Transactions in MTT*, January 1983, for classes A and Ã. The "dc" drain bias current, which is time dependent because of signal envelope variations, is given from equation (14) by $$I_D(t) = [2 + r^2(t)]I_m/8. \qquad (17)$$

It should be noted that the drain bias current varies linearly with the signal power, starting from $I_m/4$ for no signal, i.e., $r^2(t) = 0$, to $3I_m/8$ for full signal drive, i.e., $r^2(t) = 1$. In class A, that current would have been fixed at $I_m/2$, independently of the signal level. Of course, this is the main reason for the superiority of the efficiency of the PTC mode over that of class A.

The "dc" drain bias power is given, from equations (10) and (17), by $$P_D(t) \equiv E_D I_D(t) = [2 + r^2(t)]V_m I_m/16. \qquad (18)$$

The drain efficiency is defined by $$\eta_D \equiv \overline{P_o}/\overline{P_D}, \qquad (19)$$

where the overbars indicate averaging over the signal envelope variations, i.e., over $r(t)$. Finally, combining equation (19) with equations (16) and (18), one obtains the drain efficiency of the PTC mode of power amplification as $$\eta_D = \overline{2r^2}/(2 + \overline{r^2}). \qquad (20)$$

The corresponding efficiencies of classes A and Ã are given, from equations (13a), (13b) of Saleh et al, respectively, by $$\eta_D^A = \overline{r^2}/2, \qquad (21)$$

$$\eta_D^{\tilde{A}} = \overline{r^2}/2\bar{r}. \qquad (22)$$

It should be noted that for a fully driven constant-envelope signal, where $\overline{r^2} = \bar{r} = 1$, the drain efficiency for the PTC mode is 66.7 percent, while that for class A or Ã is 50 percent. However, the real advantage of the PTC mode, or, for that matter, class Ã, over standard class A is for varying-envelop signals. However, for most signals, the theoretical drain efficiency of the PTC mode is about 50 percent, i.e., about 2 dB, higher than that of standard class A, and is roughly equal to that of class Ã.

What is claimed is:

1. A power amplifier arrangement comprising:
 an input and an output terminal;
 a field effect transistor (FET) comprising a gate electrode coupled to the input terminal, a source electrode, and a drain electrode coupled to the output terminal, the FET including a transfer characteristic which includes a parabolic region; and
 drain electrode biasing means comprising (a) a first and a second quarter-wave transmission line section connected in series, one end thereof being connected to the drain electrode while the interconnection point between the two quarter-wave transmission line sections is connected to be responsive to a drain bias from a bias supply to cause the amplifier to operate over a predetermined portion of the parabolic region of the FET transfer characteristics, (b) means connected between the interconnection point of the first and second quarter-wave transmission line sections and the source electrode for preventing envelope-induced variations of the drain bias voltage and for providing a short circuit to the drain electrode for a second harmonic of an input signal, and (c) a blocking capacitor disposed between the drain electrode and the output terminal.

2. A power amplifier according to claim 1 wherein the means for preventing envelope-induced drain bias voltage variations and for providing a second harmonic short circuit comprises a capacitance.

3. A power amplifier according to claim 2 wherein said capacitance comprises:
 a first capacitor for preventing the envelope-induced variations in the drain bias signal; and
 a second capacitor disposed in parallel with the first capacitor for shorting the second harmonic of the input signal at the drain electrode.

4. A power amplifier according to claim 1 wherein the means for preventing drain bias voltage variations and for providing a second harmonic short circuit comprises:
 a capacitor for preventing the envelope-induced variations in the drain bias signal; and
 an eighth-wavelength open-circuit transmission line section for shorting the second harmonic of the input signal at the drain electrode.

* * * * *